(12) United States Patent
Komatsu

(10) Patent No.: US 7,298,158 B2
(45) Date of Patent: Nov. 20, 2007

(54) NETWORK ANALYZING APPARATUS AND TEST METHOD

(75) Inventor: Yasuaki Komatsu, Hyogo (JP)

(73) Assignee: Agilent Technologies, Inc., Santa Clara, CA (US)

(*) Notice: Subject to any disclaimer, the term of this patent is extended or adjusted under 35 U.S.C. 154(b) by 161 days.

(21) Appl. No.: 10/853,652

(22) Filed: May 25, 2004

(65) Prior Publication Data

US 2004/0249605 A1    Dec. 9, 2004

(30) Foreign Application Priority Data

May 27, 2003    (JP) .............................. 2003-149489

(51) Int. Cl.
*G01R 31/26* (2006.01)
(52) U.S. Cl. .................................... 324/765
(58) Field of Classification Search .................... None
See application file for complete search history.

(56) References Cited

U.S. PATENT DOCUMENTS 6,388,747 B2*  5/2002  Nara et al. .................. 356/394
6,748,572 B2*  6/2004  Fujine ......................... 702/64
6,784,572 B1*  8/2004  Backman et al. ............. 310/12
6,895,354 B2*  5/2005  Matsuyama et al. ........ 702/136

FOREIGN PATENT DOCUMENTS

| JP | 64-088165 | 3/1989 |
| JP | 2004361170 A | * 12/2004 |
| WO | WO 2004109527 A1 | * 12/2004 |

* cited by examiner

*Primary Examiner*—Jermele Hollington

(57) ABSTRACT

A network analyzing apparatus that analyzes the network properties of a device under test by applying reference signals to a device under test by frequency sweeping or power sweeping comprises input device for inputting the sweep range and sweep interval of these reference signals as well as the center coordinates and radius of a test circle for testing this device under test; a measurement apparatus for measuring the network properties of this device under test and obtaining measurements for n number of measurement points determined from this sweep range and sweep interval; and a testing apparatus, with this testing apparatus finding the difference between this measurement and center coordinates and, referring to this difference and this radius, determining that this measurement that has been read passes the test if the magnitude of this referred difference is no greater than this referred radius, or is less than this referred radius.

21 Claims, 6 Drawing Sheets

NETWORK ANALYZING APPARATUS AND TEST METHOD

BACKGROUND OF THE INVENTION

1. Field of the Invention

The present invention relates to a measurement apparatus that automatically tests the properties of a device under test on polar coordinates.

2. Discussion of the Background Art

A network analyzer is an example of a measurement apparatus having a polar coordinate display function (JP (Kokai) 64[1989]-88,165 (pages 2 and 3, FIG. 1)). Several types of polar coordinates are displayed by network analyzers. There are polar charts, as well as the Smith chart or immitance chart, which are modified polar charts. For example, the Smith chart is used to test the performance of electronic components. An example of testing the performance of electronic components is given below.

In general, testing the performance of electronic components is testing whether or not the measurements plotted on a Smith chart displayed on the screen of a network analyzer are within a circle having a pre-determined radius. The circle for this testing is called the test circle. For instance, electronic components pass the test when the measurement of the return loss thereof is approximately a certain complex impedance value. Today inspectors test the performance of an electronic component by affixing transparent film on which a circle having a pre-determined radius has been drawn on the screen of a network analyzer and confirming macroscopically whether or not the measurements of the electronic component are within that circle.

However, there are large fluctuations in the results of testing by macroscopic observation, and testing errors are readily produced. In particular, the test circle on the film is drawn with lines always of the same thickness and therefore, the measurement results can be hidden by the test circle, and so forth, and the testing error rate rises with points closer to the circle. There is also a problem in that it is difficult to identify a specific sweep point in the measurement results displayed with polar coordinates and therefore, it is difficult to use the test finding in combination with other tests. For instance, when filters are being mass produced and inspected, first the properties in the passband are tested using film on which the test circle has been drawn, and then overall band properties including the passband and the stopband are monitored with the sweep conditions being changed, but testing efficiency is poor. Furthermore, the measurement results of devices under test that require additional outside circuits are displayed away from the origin of the polar coordinates and therefore, when all measurement results are displayed together, the measurement results are observed in small size and this leads to testing errors. In addition, in this case it is difficult to watch the test results or measurement results while adjusting the device under test so that under optimum conditions, the measurement results are within the test circle.

The present invention provides a measurement apparatus with which it is possible to test a device under test on polar coordinates in order to solve the above-mentioned problems. Moreover, an object of the present invention is to provide a measurement apparatus with which it is possible to accurately test a device under test with stability without affecting the test circle. Additionally, the present invention provides a measurement apparatus having a test function that can be easily used in combination with other tests. The present invention also provides a measurement apparatus having a test function that facilitates the examination procedure. Furthermore, the present invention also provides a method and a program that make this apparatus feasible.

By means of the present invention, it is not necessary to draw a test circle on film, testing can be performed without displaying the test circle displayed on polar coordinates, measurement results can be displayed over the test circle when the measurement results are displayed on polar coordinates, and test circles of various shapes can be accurately set up. Moreover, the test range can be set. Therefore, measurements within a wide range that includes the test range can be simultaneously performed. Thus, the testing can be easily used in combination with other testing processes. Furthermore, as long as the difference needed for testing is calculated for all measurements, some of the operating functions of conventional network analyzing apparatuses can be salvaged and a testing function can be added with some modifications.

SUMMARY OF THE INVENTION

A network analyzing apparatus, wherein a network analyzing apparatus that analyzes the network properties of a device under test by applying reference signals to the device under test while frequency sweeping or power sweeping comprises:

a first input device for inputting the sweep range and sweep interval of these reference signals, a second input device for inputting the center coordinates and radius of a test circle for testing this device under test, a first memory device that stores these center coordinates that are input, a second memory device that stores this radius that is input, a measurement device that measures the network properties of this device under test and obtains measurements for n number of measurement points determined from this sweep range and this sweep interval, a third memory device that has elements for these n number of measurement points and that stores the sequence in which these measurements that are obtained are housed in the respective elements, and a testing device, which reads these measurements from this third memory device, reads these center coordinates from this first memory device, finds the difference between these measurements that have been read and these center coordinates that have been read, and further, reads the radius from this second memory device and, referring to this difference and this radius that has been read, determines that these measurements that have been read pass the test when the magnitude of this referred difference is no greater than this referred radius, or is less than this referred radius.

A network analyzing apparatus, wherein a network analyzing apparatus that analyzes the network properties of a device under test by applying reference signals to the device under test while frequency sweeping or power sweeping comprises:

a first input device for inputting the sweep range and sweep interval of these reference signals, a second input device for inputting the center coordinates and radius of a test circle for testing this device under test, a first memory device that stores these center coordinates that are input, a second memory device that has elements for n number of measurement points determined by this sweep range and sweep interval and that stores the sequence in which this radius that is input is housed in each of these elements, a measurement device that measures the network properties of this device under test and obtains measurements for each of these n number of measurement points, a third memory device that has elements for these n number of measurement points and that stores the sequence in which these measurements that are obtained are housed in each of these elements, and a testing device, which reads these measurements from this third memory device, reads these center coordinates from this first memory device, finds the difference between these measurements that have been read and these center coordinates that have been read, and further, reads this radius from this second memory device relating to these measurements that have been read and, referring to this difference and this radius that has been read, determines that these measurements that have been read pass the test when the magnitude of this referred difference is no greater than this referred radius, or is less than this referred radius.

A network analyzing apparatus, wherein a network analyzing apparatus that analyzes the network properties of a device under test by applying reference signals to the device under test while frequency sweeping or power sweeping comprises:

a first input device for inputting the sweep range and sweep interval of these reference signals, a second input device for inputting the center coordinates and radius of a test circle for determining whether this device under test passes the test, a first memory device that has elements for n number of measurement points determined from the above-mentioned sweep range and the above-mentioned sweep interval and that stores the sequence in which these center coordinates that are input are housed in the respective elements, and a second memory device that stores this input radius, a measurement device that measures the network properties of this device under test and obtains measurements for each of these n number of measurement points, a third memory device that has these elements for these n number of measurement points and that stores the sequence in which these measurements that are obtained are housed in each of these elements, and a testing device, which reads these measurements from this third memory device, reads these center coordinates relating to these measurements that have been read from this first memory device, finds the difference between these measurements that have been read and these center coordinates that have been read, and further, reads this radius from this second memory device and, referring to this difference and this radius that has been read, determines that these measurements that have been read pass the test when the magnitude of this referred difference is no greater than this referred radius, or is less than this referred radius.

A network analyzing apparatus, wherein a network analyzing apparatus that analyzes the network properties of a device under test by applying reference signals to the device under test while frequency sweeping or power sweeping comprises:

a first input device for inputting the sweep range and sweep interval of these reference signals, a second input device for inputting the center coordinates and radius of a test circle for testing this device under test, a first memory device having elements for n number of measurement points determined by this sweep range and sweep interval and which stores the sequence in which the center coordinates that are input are housed in the respective elements, a second memory device having the above-mentioned n number of elements and that stores the above-mentioned radius that is input, a measurement device that measures the network properties of this device under test and obtains measurements for n number of measurement points, a third memory device having the above-mentioned n number of measurement points and that stores the sequence in which these measurements that are obtained are housed in the respective elements, and a testing device that reads the above-mentioned measurements from this third memory device, reads from this first memory device the above-mentioned center coordinates relating to these measurements that have been read, finds the difference between the above-mentioned measurements that have been read and the above-mentioned center coordinates that have been read, and further, reads the above-mentioned radius relating to the above-mentioned measurements that have been read from the above-mentioned second memory device and, referring to this difference and this radius that has been read, determines that these measurements that have been read pass the test when the magnitude of this referred difference is no greater than this referred radius, or is less than this referred radius.

The network analyzing apparatus further wherein the device under test passes the test when all of the measurements housed in each of the elements of the sequence stored in this third memory device pass the test by this testing device.

The network analyzing apparatus, wherein it comprises a third input device for inputting, from the sweep range, the test range that specifies the range to be tested and in that this device under test passes the test when, of the measurements housed in each element of the sequence stored in this third memory device, all of the measurements within the test range input by this third input device pass the test by this testing device.

The network analyzing apparatus further comprising a device with which these measurements or this test circle are displayed on these polar coordinates, with the center coordinates serving as the origin of the polar coordinates.

The network analyzing apparatus further comprising that when these measurements are displayed, they are displayed in different shapes, figures, or colors in accordance with whether or not these measurements have passed the test.

A network analyzing apparatus, wherein the network analyzing apparatus comprises:

a device for measuring the network properties of a device under test, a device for testing whether or not the measurements measured by this measurement device are within a test circle represented by center coordinates and radius, and device for displaying these measurements or this test circle on polar coordinates with these center coordinates serving as the origin of the polar coordinates.

A testing method, wherein a testing method for testing a device under test in a network analyzing apparatus with which the network properties of a device under test are analyzed by applying reference signals to the device under test while frequency sweeping or power sweeping comprises:

a step wherein the sweep range and sweep interval of these reference signals are input, a step wherein the center coordinates and radius of a test circle for testing this device under test are input, a step wherein these center coordinates that are input are stored in a first memory device, a step wherein this radius that is input is stored in a second memory device, a step wherein the network properties of this device under test are measured and measurements for n number of measurement points determined from this sweep range and this sweep interval are obtained, a step wherein these measurements that are obtained are housed in the respective elements for these n number of measurement points of the sequence stored in the third memory device, and a step wherein these measurements are read from this third memory device, these center coordinates are read from this first memory device, the difference between these measurements that have been read and these center coordinates that have been read is found, and further, the radius from this second memory device is read and, referring to this difference and this radius that has been read, these measurements that have been read are determined to pass the test when the magnitude of this referred difference is no greater than this referred radius, or is less than this referred radius.

A testing method, wherein a testing method for testing a device under test in a network analyzing apparatus with which the network properties of a device under test are analyzed by applying reference signals to the device under test while frequency sweeping or power sweeping comprises:

a step wherein the sweep range and sweep interval of these reference signals are input, a step wherein the center coordinates and radius of a test circle for testing this device under test are input, a step wherein these center coordinates that are input are stored in a first memory, a step wherein this input radius is housed in each of the elements for n number of measurement points determined by this sweep range and sweep interval of the sequence stored in the second memory, a measurement device that measures the network properties of this device under test and obtains measurements for each of these n number of measurement points, a step wherein these measurements that are obtained are housed in each of the elements for these n number of measurement points of the sequence stored in a third memory device, and a step wherein these measurements are read from this third memory device, these center coordinates are read from this first memory device, the difference between these measurements that have been read and these center coordinates that have been read is found, and further, this radius relating to these measurements that have been read is read from this second memory device and, referring to this difference and this radius that has been read, it is determined that these measurements that have been read pass the test when the magnitude of this referred difference is no greater than this referred radius, or is less than this referred radius.

A testing method, wherein a testing method for testing a device under test with network analyzing apparatus with which the network properties of a device under test are analyzed by applying reference signals to the device under test while frequency sweeping or power sweeping comprises:

a step wherein the sweep range and sweep interval of these reference signals are input, a step wherein the center coordinates and radius of a test circle for determining whether this device under test passes the test are input, a step wherein these input center coordinates are housed in each of the elements for n number of measurement points determined from the above-mentioned sweep range and the above-mentioned sweep interval of the sequence stored in the first memory device, a step wherein this radius that is input is stored in the second memory device, a step wherein the network properties of this device under test are measured to obtain measurements for each of these n number of measurement points, a step wherein these measurements that are obtained are housed in these elements for n number of measurement points of the sequence stored in the third memory device, and a step wherein these measurements are read from this third memory device, these center coordinates relating to these measurements that have been read are read from this first memory device, the difference between these measurements that have been read and these center coordinates that have been read is found, and further, this radius is read from this second memory device and, referring to this difference and this radius that has been read, it is determined that these measurements that have been read pass the test when the size of this referred difference is no greater than this referred radius, or is less than this referred radius.

A testing method, wherein a testing method that tests a device under test in a network analyzing apparatus with which the network properties of a device under test are analyzed by applying reference signals to the device under test while frequency sweeping or power sweeping comprises:

a step wherein the sweep range and sweep interval of these reference signals are input, a step wherein the center coordinates and radius of a test circle for testing this device under test are input, a step wherein these center coordinates that are input are housed in each of the elements for n number of measurement points determined by this sweep range and sweep interval of the sequence stored in the first memory device, a step wherein this radius that is input is housed in each of the elements for these n number of measurement points of the sequence stored in the second memory device, a step wherein the network properties of this device under test are analyzed to obtain measurements for this n number of measurement points, a step wherein these measurements that are obtained are housed in each of the elements for this n number of measurement points of the sequence stored in the third memory device, and a step wherein the above-mentioned measurements from this third memory device are read, the above-mentioned center coordinates relating to these measurements that have been read are read from this first memory device, the difference between the above-mentioned measurements that have been read and the above-mentioned center coordinates that have been read is found, and further, the above-mentioned radius relating to the above-mentioned measurements that have been read are read from the above-mentioned second memory device and, referring to this difference and this radius that has been read, it is determined that these measurements that have been read pass the test when the magnitude of this referred difference is no greater than this referred radius, or is less than this referred radius.

The testing method further comprising the step wherein it is determined that the device under test passes the test when all of the measurements housed in each of the elements of the sequence stored in this third memory device pass the test.

The testing method further comprising a step wherein the test range that specifies the range to be tested is input from this sweep range and the step wherein it is determined that the device under test passes the test when, of the measurements housed in each element of the sequence stored in this third memory device, all of the measurements within the test range input by this third input device pass the test.

The testing device further comprising a step wherein these measurements or this test circle are displayed on these polar coordinates, with the center coordinates serving as the origin of the polar coordinates.

The testing method further comprising the device of the step wherein these measurements are displayed, they are displayed in different shapes, figures, or colors in accordance with whether or not these measurements have passed the test.

A testing method, further wherein in a testing method whereby a device under test is tested in a network analyzing apparatus comprises:

a step wherein measuring the network properties of a device under test are measured, a step wherein it is determined whether or not the measurements measured by this measurement device are within a test circle represented by center coordinates and radius, and a step wherein these measurements or this test circle are displayed on polar coordinates with these center coordinates serving as the origin of the polar coordinates.

A program, wherein a program for testing a device under test in a network analyzing apparatus with which the network properties of a device under test are analyzed by applying reference signals to the device under test while frequency sweeping or power sweeping and having a first input device, a second input device, a measurement device, a first memory device, a second memory device, and a third memory device comprises:

a step wherein the sweep range and sweep interval of these reference signals are input, a step wherein the center coordinates and radius of a test circle for testing this device under test are input, a step wherein these center coordinates that are input are stored in a first memory device, a step wherein this radius that is input is stored in a second memory device, a step wherein the network properties of this device under test are measured and measurements for n number of measurement points determined from this sweep range and this sweep interval are obtained, a step wherein these measurements that are obtained are housed in the respective elements for these n number of measurement points of the sequence stored in the third memory device, and a step wherein these measurements are read from this third memory device, these center coordinates are read from this first memory device, the difference between these measurements that have been read and these center coordinates that have been read is found, and further, the radius from this second memory device is read and, referring to this difference and this radius that has been read, these measurements that have been read are determined to pass the test when the magnitude of this referred difference is no greater than this referred radius, or is less than this referred radius.

A program, wherein a program for testing a device under test in a network analyzing apparatus with which the network properties of a device under test are analyzed by applying reference signals to the device under test while frequency sweeping or power sweeping and having a first input device, a second input device, a measurement device, a first memory device, a second memory device, and a third memory device comprises:

a step wherein the sweep range and sweep interval of these reference signals are input, a step wherein the center coordinates and the radius of a test circle for testing this device under test are input, a step wherein these center coordinates that are input are stored in a first memory, a step wherein this input radius is housed in each of the elements for n number of measurement points determined by this sweep range and sweep interval of the sequence stored in the second memory, a measurement device that measures the network properties of this device under test and obtains measurements for each of these n number of measurement points, a step wherein these measurements that are obtained are housed in each of the elements for these n number of measurement points of the sequence stored in a third memory device, and a step wherein these measurements are read from this third memory device, these center coordinates are read from this first memory device, the difference between these measurements that have been read and these center coordinates that have been read is found, and further, this radius relating to these measurements that have been read is read from this second memory device and, referring to this difference and this radius that has been read, it is determined that these measurements that have been read the test when the magnitude of this referred difference is no greater than this referred radius, or is less than this referred radius.

A program, wherein a program for testing a device under test in a network analyzing apparatus with which the network properties of a device under test are analyzed by applying reference signals to the device under test while frequency sweeping or power sweeping and having a first input device, a second input device, a measurement device, a first memory device, a second memory device, and a third memory device comprises:

a step wherein the sweep range and sweep interval of these reference signals are input, a step wherein the center coordinates and the radius of a test circle for determining whether this device under test passes the test are input, a step wherein these input center coordinates are housed in each of the elements for n number of measurement points determined from the above-mentioned sweep range and the above-mentioned sweep interval of the sequence stored in the first memory device, a step wherein this radius that is input is stored in the second memory device, a step wherein the network properties of this device under test are measured to obtain measurements for each of these n number of measurement points, a step wherein these measurements that are obtained are housed in these elements for n number of measurement points of the sequence stored in the third memory device, and a step wherein these measurements are read from this third memory device, these center coordinates relating to these measurements that have been read are read from this first memory device, the difference between these measurements that have been read and these center coordinates that have been read is found, and further, this radius is read from this second memory device and, referring to this difference and this radius that has been read, it is determined that these measurements that have been read pass the test when the magnitude of this referred difference is no greater than this referred radius, or is less than this referred radius.

A program, wherein a program for testing a device under test in a network analyzing apparatus with which the network properties of a device under test are analyzed by applying reference signals to the device under test while frequency sweeping or power sweeping and having a first input device, a second input device, a measurement device, a first memory device, a second memory device, and a third memory device comprises:

a step wherein the sweep range and sweep interval of these reference signals are input, a step wherein the center coordinates and radius of a test circle for testing this device under test are input, a step wherein these center coordinates that are input are housed in each of the elements for n number of measurement points determined by this sweep range and sweep interval of the sequence stored in the first memory device, a step wherein this radius that is input is housed in each of the elements for these n number of measurement points of the sequence stored in the second memory device, a step wherein the network properties of this device under test are analyzed to obtain measurements for this n number of measurement points, a step wherein these measurements that are obtained are housed in each of the elements for this n number of measurement points of the sequence stored in the third memory device, and a step wherein the above-mentioned measurements from this third memory device are read, the above-mentioned center coordinates relating to these measurements that have been read are read from this first memory device, the difference between the above-mentioned measurements that have been read and the above-mentioned center coordinates that have been read is found, and further, the above-mentioned radius relating to the above-mentioned measurements that have been read are read from the above-mentioned second memory device and, referring to this difference and this radius that has been read, it is determined that these measurements that have been read pass the test when the magnitude of this referred difference is no greater than this referred radius, or is less than this referred radius.

The program further comprising the step wherein it is determined that the device under test passes the test when all of the measurements housed in each of the elements of the sequence stored in this third memory device pass the test.

The program further comprising a step wherein the test range that specifies the range to be tested is input from this sweep range and the step wherein it is determined that the device under test passes the test when, of the measurements housed in each element of the sequence stored in this third memory device, all of the measurements within the test range input by this third input device pass the test.

The program further comprising a step wherein these measurements or this test circle are (is) displayed on these polar coordinates, with the center coordinates serving as the origin of the polar coordinates.

The program further comprising a device of the step wherein these measurements are displayed, they are displayed in different shapes, figures, or colors in accordance with whether or not these measurements have passed the test.

A program comprising a program with which a device under test is tested in a network analyzing apparatus comprises:

a step wherein measuring the network properties of a device under test are measured, a step wherein it is determined whether or not the measurements measured by this measurement device are within a test circle represented by center coordinates and radius, and a step wherein these measurements or this test circle are displayed on polar coordinates with these center coordinates serving as the origin of the polar coordinates.

DETAILED DESCRIPTION OF THE PREFERRED EMBODIMENT

The present invention will now be described based on the preferred embodiments shown in the attached drawings. The first embodiment of the present invention is a network analyzer and its structure is shown in FIG. 1.

Figure 1:
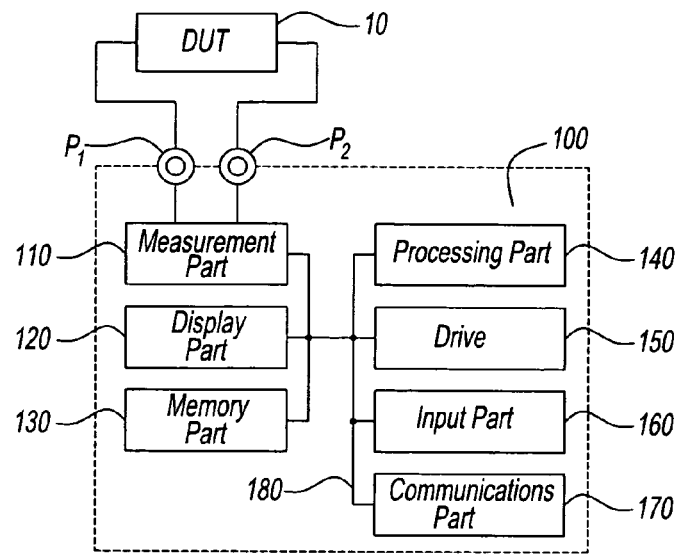
FIG. 1 is a drawing showing the general structure of the network analyzer according to a preferred embodiment of the present invention.

Network analyzer 100 in FIG. 1 comprises, as structural elements, a measurement part 110, a display part 120, a memory part 130, a processing part 140, a drive 150, an input part 160, and a communications part 170.

Measurement part 110 is a device comprising measurement port $P_1$ and measurement port $P_2$ and measures the network properties of device under test 10 connected to each port. Measurement port $P_1$ and measurement port $P_2$ are both capable of outputting reference signals and measuring the amplitude of incoming signals and outgoing signals. For convenience, measurement part 110 has two measurement ports, but it is not to be construed that the measurement part is limited to this number of ports. For instance, a conventional network analyzer has three or four ports. Measurement part 110 is connected with device under test 10, which is a two-port device, by measurement port $P_1$ and measurement port $P_2$. When measuring the reflection coefficient of device under test 10 at measurement port $P_1$, reference signals should be output from measurement port $P_1$ while frequency sweeping or power sweeping and the energy of the incoming signals and outgoing signals at measurement port $P_1$ should be measured by measurement part 110. The reflection coefficient is calculated as the ratio of the incoming signals and the outgoing signals. The ratio can be calculated by processing part 140.

Display part 120 is a means for displaying the measurements of network analyzer 100 and various data, including setting data. Display part 120 should be a means with which various data can be output, and an LED lamp or liquid crystal panel display can be used.

Memory part 130 is a memory means in which programs and various data, such as the measurements of measurement part 110, are housed. Memory part 130 is a memory means with a non-exchangeable memory medium. For example, memory part 130 is a RAM, a register inside a CPU, or a hard disk drive.

Processing part 140 is a computer means with which at least one function is provided by executing a program. In the present embodiment, processing part 140 is a microprocessor. However, processing part 140 is not limited to a microprocessor and can be another type of processor having operating functions and control functions, such as a digital signal processor. Moreover, processing part 140 can also comprise two or more processors. Processing part 140 controls the operation of the entire network analyzer 100 and processes the measurements from measurement part 110, and so forth. The programs executed by control part 120 are either housed in memory part 130, read from drive 150, or received through input part 160.

Drive part 150 is a memory means in which programs and various data, such as the measurements of measurement part 110, are housed. Drive part 150 is a memory means with an exchangeable memory medium. For instance, drive 150 is a CD-ROM drive or a memory card reader.

Input part 160 is an example of an input means and is a means that receives data input from the user of network analyzer 100. For example, input part 160 can comprise an input means that is appropriate for data input, such as a button, vernier knob, or keyboard.

Communications part 170 is a means that allows network analyzer 100 to communicate with outside devices. For instance, communications part 170 can comprise a serial interface, a parallel interface, or a LAN interface. Communications part 170 can execute functions of memory part 130 or input part 160 and so forth when data are received through a communications medium. In addition, communications part 170 can also execute the functions of display part 120 when data are transmitted through a communications medium.

Measurement part 110, display part 120, memory part 130, processing part 140, drive 150, input part 160, and communications part 170 can communicate with one another when connected together using a bus 180.

Figure 2:
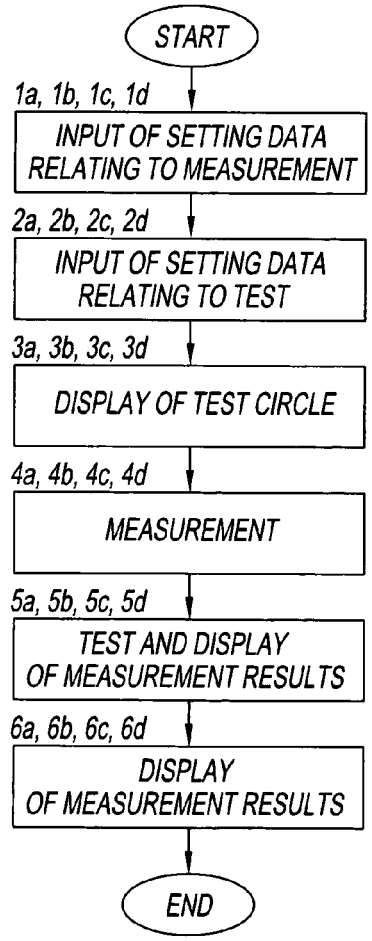
FIG. 2 is a flow chart showing the operation of the network analyzer according to a preferred embodiment of the present invention.
Figure 3:
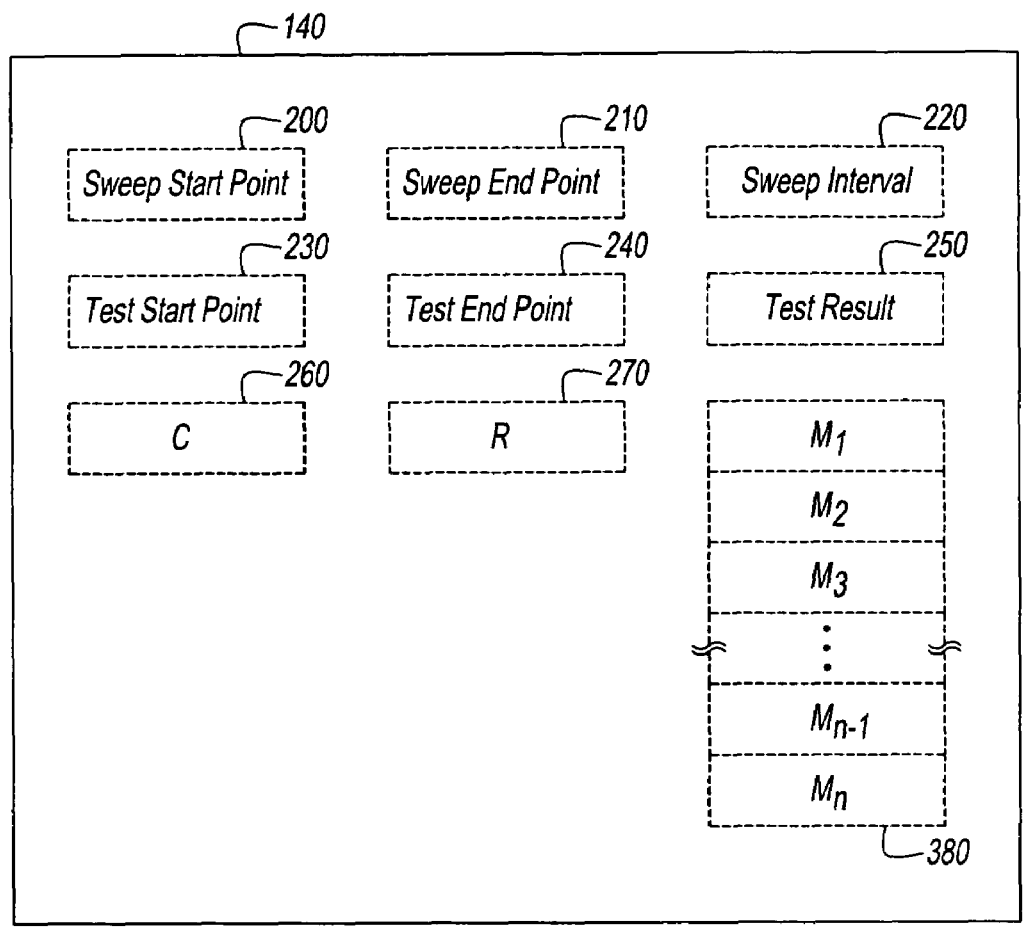
FIG. 3 is a drawing showing the inside of a memory part of the network analyzer according to a preferred embodiment of the present invention.

Next, the operating procedure of network analyzer 100 is described below. As previously described, network analyzer 100 operates under the control of processing part 140 that executes programs. Consequently, the following operating procedure also describes the flow of the program executed by processing part 140. The flow chart showing the operating procedure of network analyzer 100 is shown in FIG. 2. FIG. 3 shows the memory regions in memory part 130. The following description refers to FIGS. 1, 2, and 3.

First, in step 1*a*, the setting data relating to measurement are input. Network analyzer 100 inputs the sweep range and sweep interval of the reference signals through input part 160 and the input sweep range and sweep interval are housed in memory part 130. The sweep range at this time is defined by the combination of the sweep start point and the sweep end point. Consequently, memory part 130 comprises a memory region 200 for storing the sweep start point, a memory region 210 for storing the sweep end point, and a memory region 220 for storing the sweep interval. Moreover, the sweep range can be defined by both the middle of the sweep range and the sweep width, and in this case, memory region 200 and memory region 210 house the middle of the sweep range and the sweep amplitude in place of the sweep start point and the sweep end point. Power is input for the sweep start point, sweep end point, middle of the sweep range, sweep amplitude, and sweep interval in the case of power sweep, while frequency is input in the case of frequency sweep. Moreover, the sweep start point, sweep end point, middle of the sweep range, sweep width, and sweep interval are all real numbers.

Next, in step 2*a*, the setting data relating to the test are input. Network analyzer 100 inputs the range of the subject of testing, as well as the center coordinates and radius of the test circle for inspecting the device under test, through input part 160, and the input test range, center coordinates, and radius are housed in memory part 130. The range of the subject of testing is defined by the sweep range of the reference signals and by the combination of the test start point and test end point. Consequently, memory part 130 comprises a memory region 230 for storing the test start point, a memory region 240 for storing the test end point, a memory region 260 for storing the center coordinates, and a memory region 270 for storing the radius. In addition, the range of the object of the testing can be defined by the combination of the center of the test range and the width of the test range, and in this case, memory region 230 and memory region 240 house the center of the test range and the width of the test range in place of the test start point and test end point. Power is input for the sweep start point, sweep end point, middle of the sweep range, sweep amplitude, and sweep interval in the case of power sweep, while frequency is input in the case of frequency sweep. The test start point, test end point, middle of the test range, width of the test range, and radius of the test circle are real numbers. Moreover, the center coordinates of the test circle are complex numbers.

Next, in step 3*a*, network analyzer 100 displays the test circle on display part 120. The test circle is drawn as a collection of points $L_k$ represented by the following formula, or as a collection of lines that connect points $L_k$ to one another represented by the following formula. Processing part 140 controls calculations of the following formula and display part 120 based on the calculation results. It should be noted that the test circle is drawn on polar coordinates that are displayed on display part 120.

[Mathematical Formula 1]

$$L_k = \left(R \cdot \sin\frac{2\pi k}{M} + C_r\right) + j\left(R \cdot \cos\frac{2\pi k}{M} + C_i\right)$$

Here, k is an integer from 0 to (M−1). M is the number of partitions in the test circle and can be any number. R is the radius stored in memory region 270. $C_r$ is the value of the real part of the center coordinates stored in memory region 260. $C_i$ is the value of the imaginary part of the center coordinates stored in memory region 260. The radius, center coordinates, sweep range, and sweep interval used in the calculation of the above-mentioned formula are each read by processing part 140 from the corresponding memory regions.

Next, in step 4*a*, network analyzer 100 measures the network properties of device under test 10. The details are as follows. First, measurements are obtained by measurement part 110 for n number of measurement points. The number of measurement points n is the value that is obtained by adding the number 1 to the value obtained when the width of the sweep range is divided by the sweep interval. n number of measurements are housed in a memory region 380 of memory part 130. A complex sequence consisting of elements $M_1$ through $M_n$ is stored in memory region 380. Each of n number of measurements is housed in the respective element of the complex sequence. The subscript n of element $M_n$ is the identification number of the element.

Next, in step 5a, network analyzer 100 tests and displays the measurement results. The details are as described in the following. First, processing part 140 reads the measurements housed in the elements of the sequence of memory region 380. When the measurements that have been read are measured outside the test range, processing part 140 controls display part 120 such that points are plotted in the usual color on the polar coordinates using the measurements that have been read. If the measurements that have been read are measured within the test range, processing part 140 further reads the center coordinates housed in memory region 260 and the radius housed in memory region 270. Moreover, processing part 140 subtracts the center coordinates that have been read from the measurements that have been read to obtain the difference. Processing part 140 refers to the difference that is obtained and the radius that has been read and if the size of the referred difference is no greater than the referred radius, the test is passed. Moreover, the test is also passed if the size of the referred difference is less than the referred radius. When the test has been passed, processing part 140 controls display part 120 and plots points in the usual color on the polar coordinates using the measured values that have been read. On the other hand, when the test has not been passed, processing part 140 plots in a color that is different from the usual color on the polar coordinates using the measurements that have been read and sets memory region 250 to "1." It should be noted that memory region 250 is inside memory part 130 and the results of the test are housed in memory part 130. A test result housed in memory region 250 of "0" indicates that the test is passed, and a test result of "1" indicates that the test was not passed. Memory region 250 is initially set at "0." The above-mentioned processing in step 5a is performed for all measurements. Moreover, interpolation between the points that are plotted is accomplished using straight lines and approximate curves as necessary. In addition, marks can be made in places related to measurements when measurements are displayed on polar coordinates and therefore, the plotted points can be represented by abbreviations, symbols, and so forth.

Finally, in step 6a, network analyzer 100 displays the test results. Specifically, processing part 140 reads memory region 250 inside memory part 130 and the following processing is performed in accordance with this reading. When memory region 250 is "0," processing part 140 displays "device under test 10 passes the test" on display part 120. On the other hand, when memory region 250 is "1," processing part 140 displays "device under test 10 does not pass the test" on display part 120.

The test circle in the first embodiment is circular, but there are cases where, depending on the properties of device under test 10, it is preferred that the test circle is not circular. Therefore, a second and a third embodiment wherein the test circle can be defined other than circular are described below.

The second embodiment of the present invention is a network analyzer and its structure is shown in FIG. 1. However, the operation of network analyzer 100 of the second embodiment differs from the operation of network analyzer 100 of the first embodiment.

Figure 4:
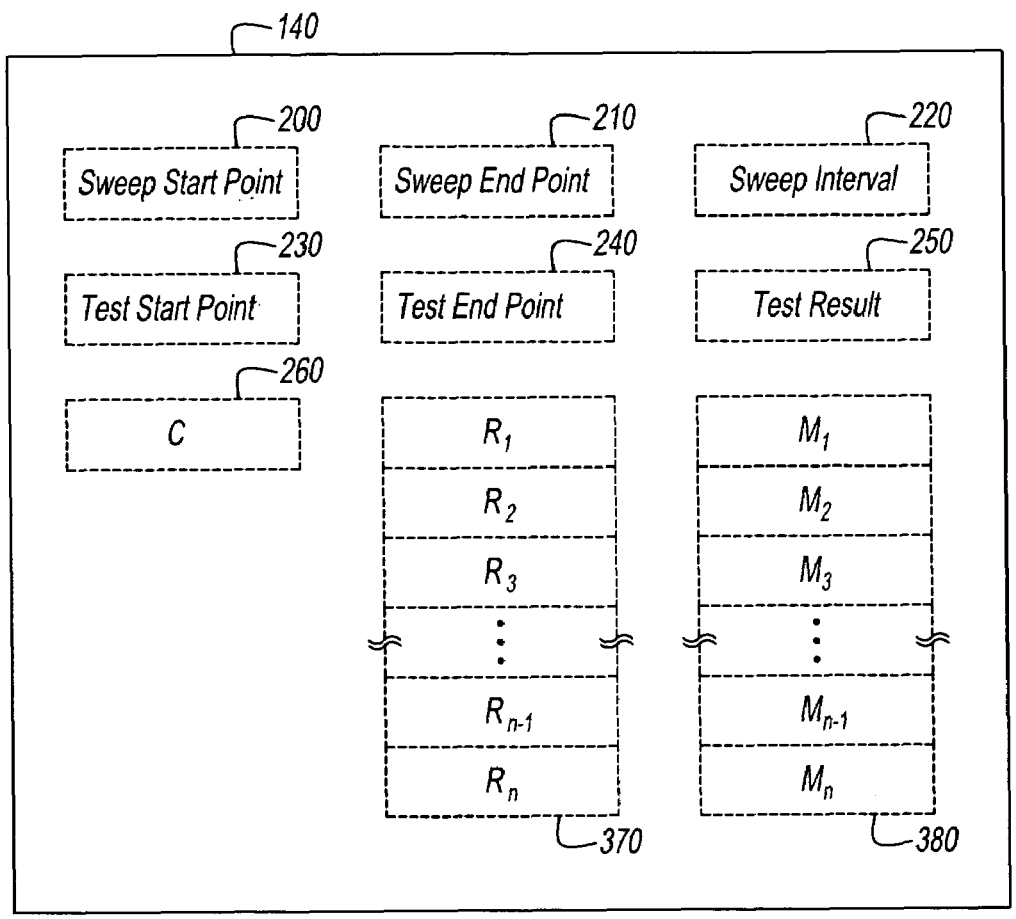
FIG. 4 is a drawing showing the inside of a memory part of the network analyzer according to another embodiment of the present invention.

The operating procedure of network analyzer 100 of the second embodiment is described below. As previously explained, network analyzer 100 is operated under the control of processing part 140 that executes programs. Consequently, the following operating procedure describes the flow of the program executed by processing part 140. The flow chart showing the operating procedure of network analyzer 100 here is shown in FIG. 2. Moreover, FIG. 4 shows the memory region contained in memory part 130. The following description refers to FIGS. 1, 2, and 4.

First, in step 1b, the setting data related to measurement are input. The same processing as in step 1a is performed in step 1b.

Next, in step 2b, the setting data related to testing are input. Network analyzer 100 inputs the range of the subject of testing and the center coordinates and radius for testing a device under test through input part 160 and the input test range, center coordinates, and radius are housed in memory part 130. The range of the subject of testing is defined by the sweep range of the reference signals and by the combination of the test start point and the test stop point. Consequently, memory part 130 comprises memory region 230 for storing the test start point, memory region 240 for storing the test end point, memory region 260 for storing the center coordinates, and a memory region 370 for storing the radius. A real number sequence consisting of elements $R_1$ to $R_n$ is stored in memory region 370. n is the number of measurement points and is the number that is obtained by adding the number 1 to the value that is obtained when the width of the sweep range is divided by the sweep interval. n number of radii are housed in each element of the real number sequence. The subscript n of element $R_n$ is the identification number of the element. If the values of the elements of the sequence of memory region 370 are all the same, the test circle is circular. The test circle becomes another shape, such as oval or rectangular, when the value of the elements of the sequence of memory region 370 are changed. In the present specification, the boundary lines for testing that are given by the center coordinates and radius are not limited to these shapes and are referred to as the test circle. Moreover, the range of the subject of testing can be defined by the combination of the center of the test range and the width of the test range. In this case, memory regions 230 and 240 house the center of the test range and the width of the test range rather than the test start point and the test end point. The test start point, test end point, center of the test range, and width of the test range are input as electrical power during power sweeping and as frequency during frequency sweeping. The test start point, test end point, center of the test range, and width of the test range, and the radius of the test circle are real numbers. Moreover, the center coordinates of the test circle are complex numbers.

Next, in step 3b, network analyzer 100 displays the test circle on display part 120. The test circle is drawn as a collection of points $L_k$ represented by the following formula, or as a collection of lines that connect points $L_K$ to one another represented by the following formula. Processing part 140 controls calculations of the following formula and display part 120 based on the calculation results. It should be noted that the test circle is drawn on polar coordinates that are displayed on display part 120.

[Mathematical Formula 2]

$$L_k = \left(R_k \cdot \sin\frac{2\pi k}{n} + C_r\right) + j\left(R_k \cdot \cos\frac{2\pi k}{n} + C_i\right)$$

Here, n is the number of measurement points. k is an integer from 0 to (n−1). R is the radius housed in element $R_k$ of the sequence of memory region 370. $C_r$ is the value of the real part of the center coordinates stored in memory region 260. $C_i$ is the value of the imaginary part of the center coordinates stored in memory region 260. The radius, center coordinates, sweep range, and sweep interval used in the calculation of the above-mentioned formula are each read by processing part 140 from the corresponding memory regions.

Next, in step 4b, network analyzer 100 measures the network properties of device under test 10. The same processing as in step 4a is performed in step 4b.

Next, in step 5b, network analyzer 100 tests and displays the measurement results. The details are as described below. First, processing part 140 reads the measurements housed in the elements of the sequence of memory region 380. When the measurements that have been read are measured outside the test range, processing part 140 controls display part 120 such that points are plotted in the usual color on the polar coordinates using the measurements that have been read. If the measurements that have been read are measured within the test range, processing part 140 further reads the center coordinates housed in memory region 260. Moreover, processing part 140 subtracts the center coordinates that have been read from the measurements that have been read to obtain the difference. Then processing part 140 reads the radius housed in the elements of the sequence of memory region 370. At this time, the radius is read in relation to the measurements that were read when the difference was obtained. For instance, the radius is read so that the identification number of the element of the sequence of memory region 370 coincides with the identification number of the element of the sequence of memory region 380 that was read when the difference was obtained. Processing part 140 refers to the difference that is obtained and the radius that has been read and if the magnitude of the referred difference is no greater than the referred radius, the test is passed. Moreover, the test is also passed if the magnitude of the referred difference is less than the referred radius. When the test has been passed, processing part 140 controls display part 120 and plots points in the usual color on the polar coordinates using the measured values that have been read. On the other hand, when the test has not been passed, processing part 140 plots in a color that is different from the usual color on the polar coordinates using the measurements that have been read and sets memory region 250 to "1." It should be noted that memory region 250 is inside memory part 130 and the results of the test are housed in memory part 130. A test result housed in memory region 250 of "0" indicates that the test is passed, and a test result of "1" indicates that the test was not passed. Memory region 250 is initially set at "0." The above-mentioned processing in step 5a is performed for all measurements. Moreover, interpolation between the points that are plotted is accomplished using straight lines and approximate curves as necessary. In addition, marks can be made in places related to measurements when measurements are displayed on polar coordinates and therefore, the plotted points can be represented by abbreviations, symbols, and so forth.

Finally, in step 6b, network analyzer 100 displays the test results. The same processing as in step 6a is performed in step 6b.

A third embodiment will now be described.

The third embodiment of the present invention is a network analyzer and its structure is shown in FIG. 1. However, the operation of network analyzer 100 of the third embodiment differs from the operation of network analyzer 100 of the first embodiment.

Figure 5:
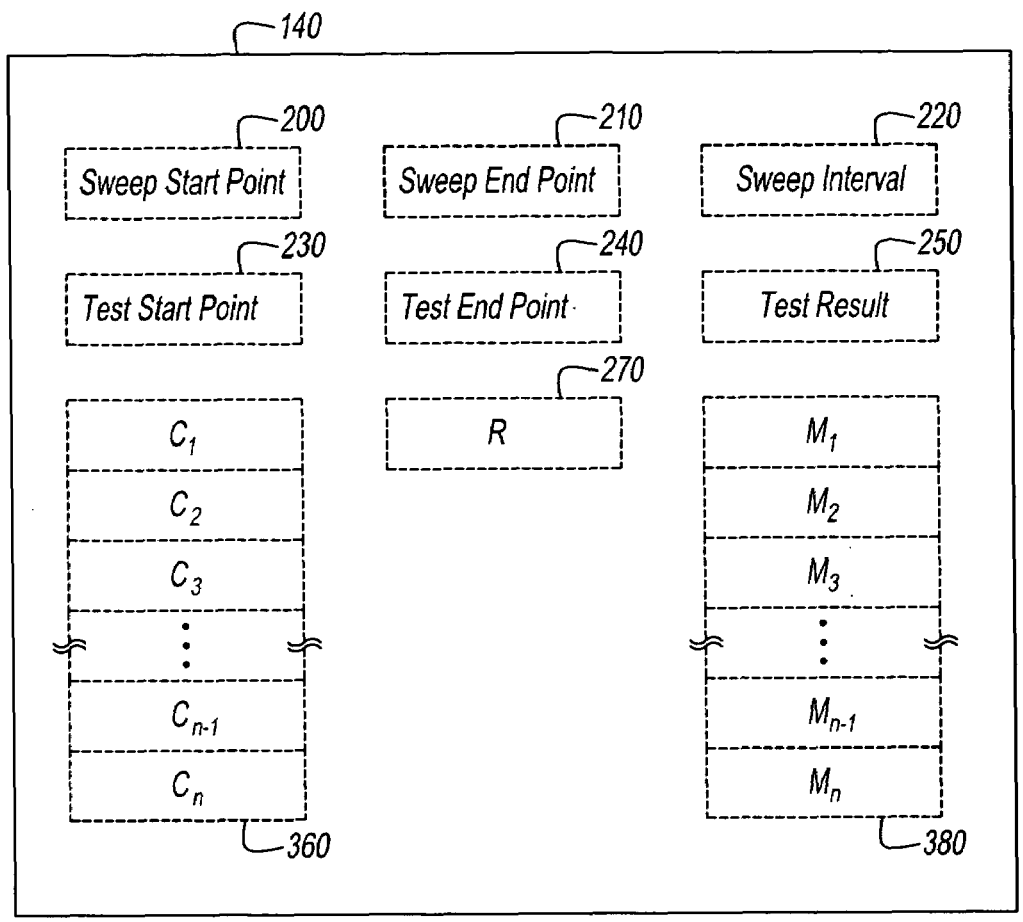
FIG. 5 is a drawing showing the inside of a memory part of the network analyzer according to another embodiment of the present invention.

The operating procedure of network analyzer 100 of the third embodiment is described below. As previously explained, network analyzer 100 is operated under the control of processing part 140 that executes programs. Consequently, the following operating procedure describes the flow of the program executed by processing part 140. The flow chart showing the operating procedure of network analyzer 100 here is shown in FIG. 2. Moreover, FIG. 5 shows the memory regions contained in memory part 130. The following description refers to FIGS. 1, 2, and 5.

First, in step 1c, the setting data related to measurement are input. The same processing as in step 1a is performed in step 1c.

Next, in step 2c, the setting data related to testing are input. Network analyzer 100 inputs the range of the subject of testing and the center coordinates and radius for testing a device under test through input part 160 and the input test range, center coordinates, and radius are housed in memory part 130. The range of the subject of testing is defined by the sweep range of the reference signals and by the combination of the test start point and the test stop point. Consequently, memory part 130 comprises a memory region 230 for storing the test start point, a memory region 240 for storing the test end point, a memory region 360 for storing the center coordinates, and a memory region 270 for storing the radius. A complex sequence consisting of components $C_1$ to $C_n$ is stored in memory region 360. n is the number of measurement points and is the number that is obtained by adding the number 1 to the value that is obtained when the width of the sweep range is divided by the sweep interval. n number of center coordinates are housed in each component of the complex sequence. The subscript n of component $C_n$ is the identification number of the component. If the values of the components of the sequence of memory region 360 are all the same, the test circle is circular. The test circle becomes another shape when the values of the components of the sequence of memory region 360 are changed. Moreover, the range of the subject of testing can be defined by the combination of the center of the test range and the width of the test range, and in this case, memory regions 230 and 240 house the center of the test range and the width of the test range rather than the test start point and the test end point. Power is input for the sweep start point, sweep end point, center of the sweep range, sweep amplitude, and sweep interval in the case of power sweep, while frequency is input in the case of frequency sweep. The test start point, test end point, center of the test range, and width of the test range are input as electrical power during power sweeping and as frequency during frequency sweeping. The test start point, test end point, center of the test range, and width of the test range, and the radius of the test circle are real numbers. Moreover, the center coordinates of the test circle are complex numbers.

Next, in step 3c, network analyzer 100 displays the test circle on display part 120. The test circle is drawn as a collection of points $L_k$ represented by the following formula, or as a collection of lines that connect points $L_k$ to one another represented by the following formula. Processing part 140 controls calculations of the following formula and display part 120 based on the calculation results. It should be noted that the test circle is drawn on polar coordinates that are displayed on display part 120.

[Mathematical Formula 3]

$$L_k = \left[R \cdot \sin\frac{2\pi k}{n} + C_{kr}\right] + j\left[R \cdot \cos\frac{2\pi k}{n} + C_{ki}\right]$$

Here, n is the number of measurement points. k is an integer from 0 to (n−1). R is the radius stored in memory region 270. $C_{kr}$ is the value of the real part of the center coordinates housed in element $C_k$ of the sequence of memory region 360. $C_{ki}$ is the value of the imaginary part of the center coordinates housed in element $C_k$ of the sequence of memory region 360. The radius, center coordinates, sweep range, and sweep interval used in the calculation of the above-mentioned formula are each read by processing part 140 from the corresponding memory region.

Next, in step 4c, network analyzer 100 measures the network properties of device under test 10. The same processing as in step 4a is performed in step 4c.

Next, in step 5c, network analyzer 100 tests and displays the measurement results. The details are as described below. First, processing part 140 reads the measurements housed in the elements of the sequence of memory region 380. When the measurements that have been read are measured outside the test range, processing part 140 controls display part 120 such that points are plotted in the usual color on the polar coordinates using the measurements that have been read. If the measurements that have been read are measured within the test range, processing part 140 further reads the center coordinates housed in the elements of the sequence of memory region 360. At this time, the center coordinates are read in relation to the measurements that were just previously read. For instance, the center coordinates are read so that the identification number of the element of the sequence of memory region 360 coincides with the identification number of the sequence of memory region 380. Moreover, processing part 140 subtracts the center coordinates that have been read from the measurements that were previously read to obtain the difference. Then processing part 140 reads the radius stored in memory region 270. Processing part 140 refers to the difference that is obtained and the radius that has been read and if the magnitude of the referred difference is no greater than the referred radius, the test is passed. Moreover, the test is also passed if the magnitude of the referred difference is less than the referred radius. When the test has been passed, processing part 140 controls display part 120 and plots points in the usual color on the polar coordinates using the measured values that have been read. On the other hand, when the test has not been passed, processing part 140 plots in a color that is different from the usual color on the polar coordinates using the measurements that have been read and sets memory region 250 to "1." It should be noted that memory region 250 is inside memory part 130 and the results of the test are housed in memory part 130. A test result housed in memory region 250 of "0" indicates that the test has been passed, and a test result of "1" indicates that the test was not passed. Memory region 250 is initially set at "0." The above-mentioned processing in step 5c is performed for all measurements. Moreover, interpolation between the points that are plotted is accomplished using straight lines and approximate curves as necessary. In addition, marks can be made in places related to measurements when measurements are displayed on polar coordinates and therefore, the plotted points can be represented by abbreviations, symbols, and so forth.

Finally, in step 6c, network analyzer 100 displays the test results. The same processing as in step 6a is performed in step 6c.

The technologies used in the second and third embodiments can also be combined. This modification is described below as a fourth embodiment.

The fourth embodiment of the present invention is a network analyzer and its structure is shown in FIG. 1. However, the operation of network analyzer 100 of the fourth embodiment differs from the operation of network analyzer 100 of the first embodiment.

Figure 6:
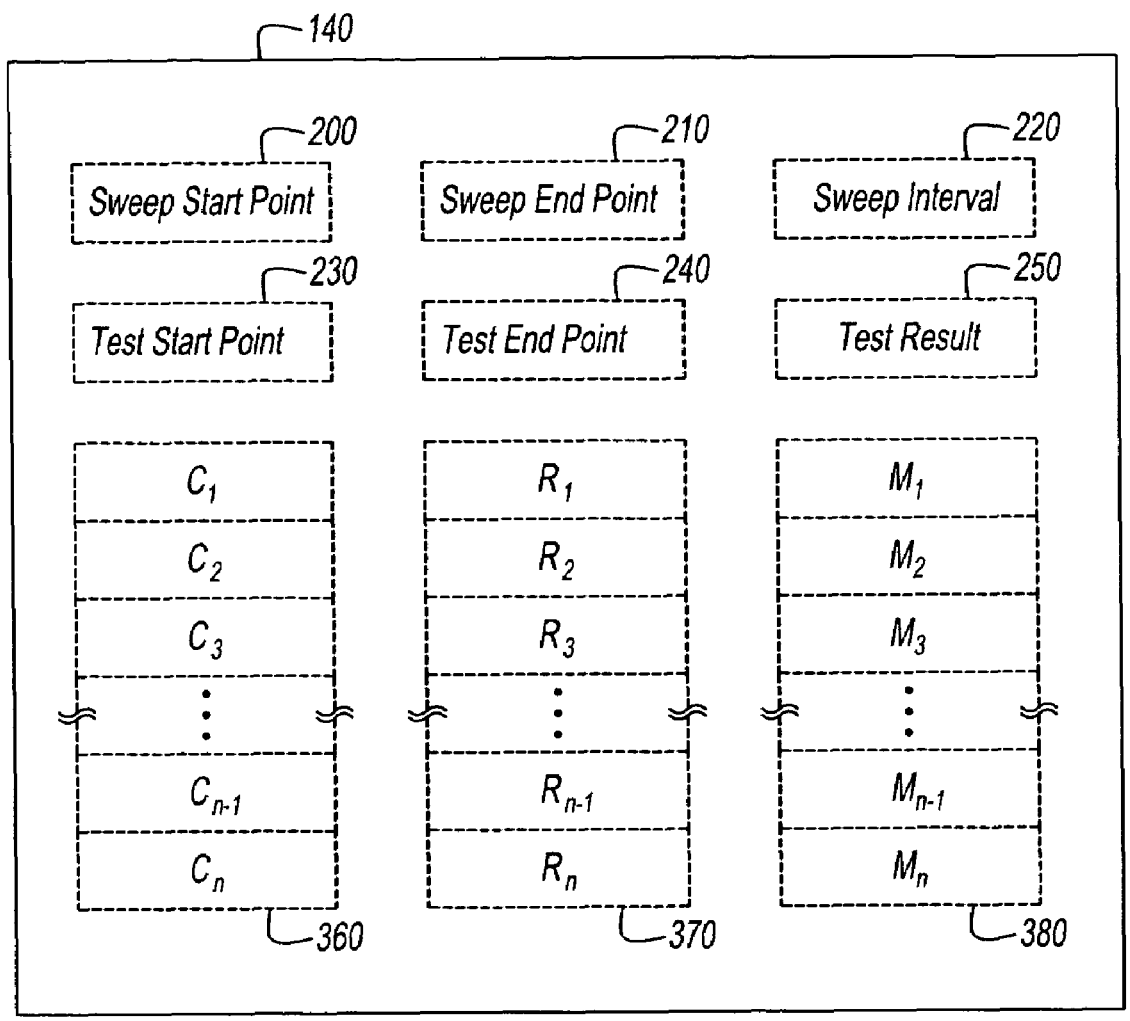
FIG. 6 is a drawing showing the inside of a memory part of the network analyzer according to another embodiment of the present invention.

The operating procedure of network analyzer 100 of the fourth embodiment is described below. As previously explained, network analyzer 100 is operated under the control of processing part 140 that executes programs. Consequently, the following operating procedure describes the flow of the program executed by processing part 140. The flow chart showing the operating procedure of network analyzer 100 here is shown in FIG. 2. Moreover, FIG. 6 shows the memory region contained in memory part 130. The following description refers to FIGS. 1, 2, and 6.

First, in step 1d, the setting data related to measurement are input. The same processing as in step 1a is performed in step 1d.

Next, in step 2d, the setting data related to testing are input. Network analyzer 100 inputs the range of the subject of testing and the center coordinates and radius for testing a device under test through input part 160 and the input testing range, center coordinates, and radius are housed in memory part 130. The range of the subject of testing is defined by the sweep range of the reference signals and by the combination of the test start point and the test stop point. Consequently, memory part 130 comprises memory region 230 for storing the test start point, memory region 240 for storing the test end point, memory region 360 for storing the center coordinates, and a memory region 370 for storing the radius. A complex sequence consisting of components $C_1$ to $C_n$ is stored in a memory region 360. n is the number of measurement points and is the number that is obtained by adding the number 1 to the value that is obtained when the width of the sweep range is divided by the sweep interval. n number of center coordinates are housed in each element of the complex sequence. The subscript n of component $C_n$ is the identification number of the component. If the values of the components of the sequence of memory region 360 and memory region 370 are all the same, the test circle is circular. The test circle becomes another shape when the values of the components of the sequence of memory region 360 or memory region 370 are changed. Moreover, the range of the subject of testing can be defined by the combination of the center of the test range and the width of the test range, and in this case, memory regions 230 and 240 house the center of the test range and the width of the test range rather than the test start point and the test end point. Power is input for the sweep start point, sweep end point, center of the sweep range, sweep amplitude, and sweep interval in the case of power sweep, while frequency is input in the case of frequency sweep. The test start point, test end point, center of the test range, and width of the test range are input as electrical power during power sweeping and as frequency during frequency sweeping. The test start point, test end point, center of the test range, and width of the test range, and the radius of the test circle are real numbers. Moreover, the center coordinates of the test circle are complex numbers.

Next, in step 3d, network analyzer 100 displays the test circle on display part 120. The test circle is drawn as a collection of points $L_k$ represented by the following formula, or as a collection of lines that connect points $L_k$ to one another represented by the following formula. Processing part 140 controls calculations of the following formula and display part 120 based on the calculation results. It should be noted that the test circle is drawn on polar coordinates that are displayed on display part 120.

[Mathematical Formula 4]

$$L_k = \left[ R_k \cdot \sin\frac{2\pi k}{n} + C_{kr} \right] + j \left[ R_k \cdot \cos\frac{2\pi k}{n} + C_{ki} \right]$$

Here, n is the number of measurement points. k is an integer from 0 to (n−1). R is the radius housed in element $R_k$ of the sequence of memory region 370. $C_{kr}$ is the value of the real part of the center coordinates housed in element $C_k$ of the sequence of memory region 360. $C_{ki}$ is the value of the imaginary part of the center coordinates housed in element $C_k$ of the sequence of memory region 360. The radius, center coordinates, sweep range, and sweep interval used in the calculation of the above-mentioned formula are each read by processing part 140 from the corresponding memory region.

Next, in step 4d, network analyzer 100 measures the network properties of device under test 10. The same processing as in step 4a is performed in step 4d.

Next, in step 5d, network analyzer 100 tests and displays the measurement results. The details are as described below. First, processing part 140 reads the measurements housed in the elements of the sequence of memory region 380. When the measurements that have been read are measured outside the test range, processing part 140 controls display part 120 such that the points are plotted in the usual color on the polar coordinates using the measurements that have been read. If the measurements that have been read are measured within the test range, processing part 140 further reads the center coordinates housed in the elements of the sequence of memory region 360. At this time, the center coordinates are read in relation to the measurements that were just previously read. For instance, the center coordinates are read so that the identification number of the element of the sequence of memory region 360 coincides with the identification number of the sequence of memory region 380. Moreover, processing part 140 subtracts the center coordinates that have been read from the measurements that were previously read to obtain the difference. Then processing part 140 reads the radius stored in the elements of the sequence of memory region 370. At this time, the radius is read in relation to the measurements that were read when the difference was obtained. For instance, the radius is read so that the identification number of the element of the sequence of memory region 370 coincides with the identification number of the element of the sequence of memory region 380 that was read when the difference was obtained. Processing part 140 refers to the difference that was just previously obtained and the radius that has been read and if the magnitude of the referred difference is no greater than the referred radius, the test is passed. Moreover, the test is also passed if the magnitude of the referred difference is less than the referred radius. When the test has been passed, processing part 140 controls display part 120 and plots points in the usual color on the polar coordinates using the measured values that have been read.

On the other hand, when the test has not been passed, processing part 140 plots in a color that is different from the usual color on the polar coordinates using the measurements that have been read and sets memory region 250 to "1." It should be noted that memory region 250 is inside memory part 130 and the results of the test are housed in memory part 130. A test result housed in memory region 250 of "0" indicates that the test is passed, and a test result of "1" indicates that the test was not passed. Memory region 250 is initially set at "0." The above-mentioned processing in step 5d is performed for all measurements. Moreover, interpolation between the points that are plotted is accomplished using straight lines and approximate curves as necessary. In addition, marks can be made in places related to measurements when measurements are displayed on polar coordinates and therefore, the plotted points can be represented by abbreviations, symbols, and so forth.

Finally, in step 6d, network analyzer 100 displays the test results. The same processing as in step 6a is performed in step 6d.

Figure 7:
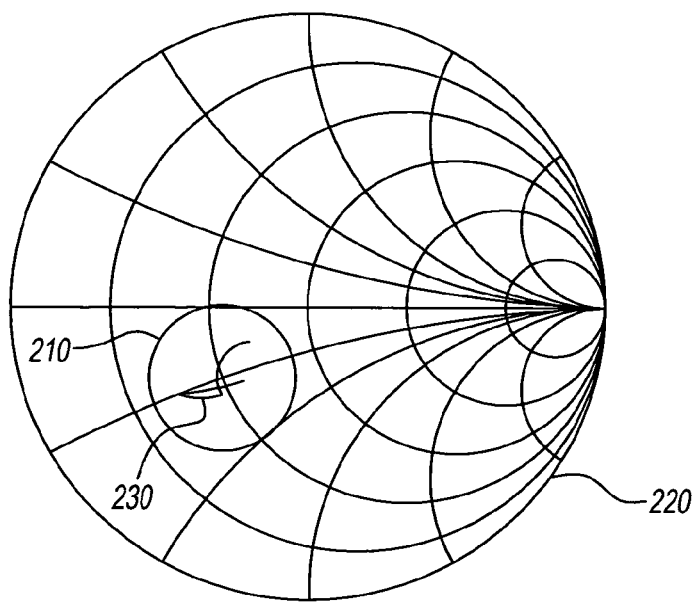
FIG. 7 is a drawing showing an example of the display of the network analyzer according to a preferred embodiment of the present invention.
Figure 8:
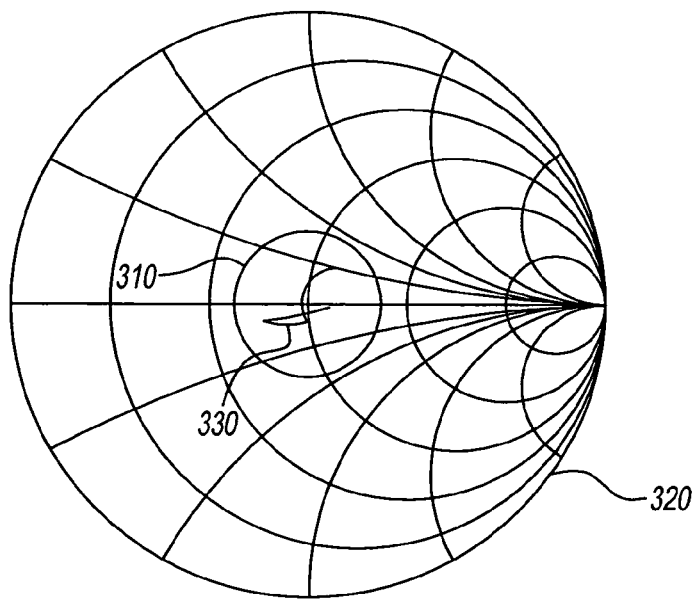
FIG. 8 is a drawing showing an example of the display of the network analyzer according to another embodiment of the present invention.

FIG. 7 shows is an example of the display in the first through fourth embodiments. In FIG. 7, a test circle 210 is drawn on polar coordinates 220 based on center coordinates and radius and measurement results 230 are further displayed on the same polar coordinates. However, there are times when it is difficult to display and see test circle 210 and measurement results 230 near the corners of polar coordinates 220 with this type of display form. Therefore, a new display method is proposed. An example of display by the new display method is shown in FIG. 8. By means of the new display method, a test circle 310 and measurement results 330 are drawn on polar coordinates 320 with the center coordinates of test circle 310 serving as the origin. In each of the above-mentioned four embodiments, the test circle should be displayed using the radius and the measurement results should be displayed using the difference calculated for the measurements during testing. By means of this display form, the test circle and measurements are displayed close to the center of the polar coordinates and therefore, the test circle and measurements can be easily enlarged as much as possible and displayed. This enlarged display is very convenient when the device under test is being adjusted as it is being measured so that it will pass the test. Furthermore, when the above-mentioned new display method is used, the following changes should be made to each of the above-mentioned four embodiments. First, in steps 3a, 3b, 3c, and 3d, respectively, the test circle is drawn with the origin at R+j0. However, R is the property impedance set in the network analyzer. In this connection, the reflection coefficient at the starting point becomes 0+j0. Moreover, in steps 5a, 5b, 5c, and 5d, respectively, the difference is calculated relating to all of the measurement results, the measurement results are displayed using the difference, and only the measurements that are measured by in the test range are inspected.

Moreover, if the difference relating to all of the measurements is calculated as described above, some of the operating functions of a conventional network analyzing apparatus can be salvaged and a test function can be added with small modifications. For instance, the difference for all of the measurements should be found before steps 5a, 5b, 5c, and 5d, respectively, and the measurements should be tested in steps 5a, 5b, 5c, and 5d, respectively, based on these pre-calculated differences.

Furthermore, testing is performed within the test range in the first through fourth embodiments, but it is also possible to test all measurements. In this case, the process of inputting the test range, and so forth can be omitted.

The operator can easily identify measurement results if the measurement results are displayed written over the test circle in the first through fourth embodiments.

Moreover, the display of the test circle in steps 3a, 3b, 3c, and 3d, respectively, and the display of the measurement results in steps 5a, 5b, 5c, and 5d, respectively can be omitted. For instance, there are cases where testing should already be performed in a production line that is fully automated, making display of the test circle and display of the measurement results unnecessary.

Furthermore, the setting data are input through input part 160 in the first through fourth embodiments, but it is not necessary to limit input to this part. The sweep range or sweep interval of the reference signals, the center coordinates or radius of the test circle, the test range, and other setting data can also be input through drive 150 or communications part 170. For instance, setting data can be input by supporting a floptical disk on which setting data have been pre-written in drive 150 and reading the setting data from the floptical disk as necessary. The setting data can also be input from a remote station through communications part 170.

In addition, the first through fourth embodiments are not limited to one sweep range and one sweep interval. Multiple sweep ranges are not necessarily the same or continuous. Multiple sweep intervals are not necessarily the same. For instance, the sweep range and sweep interval can be input into network analyzer 100 so that sweeping is performed at 1 MHz for 1 to 5 MHz, at 100 kHz for 7 to 13 MHz, at 1 MHz for 10 to 20 MHz, and at 5 MHz for 20 to 70 MHz. The first through fourth embodiments will likely be modified in some way when multiple combinations of sweep ranges and sweep intervals are defined as described above. For instance, the embodiments are modified so that the necessary setting data can be input and memory regions inside memory part 130 are added and the appropriate group of the multiple groups of sweep ranges and sweep intervals are referred to during display of the test circle and testing. The necessary modifications will be obvious to persons skilled in the art. It goes without saying that the embodiments are not limited to one test range either.

The number of measurement points and testing interval are closely related in the first through fourth embodiments and therefore, the number of test points can be input and used in place of the sweep interval. This is because the sweep interval can be found by calculation from the sweep range and the number of measurement points in the sweep range in question.

The above-mentioned embodiments and modifications thereof are only embodiments for describing the present invention cited in the scope of patent claims and it will be clear to persons skilled in the art that a variety of changes can be made within the scope of the patent claims.

What is claimed is:

1. A network analyzing apparatus, wherein the network analyzing apparatus comprises
   a means for inputting center coordinates and radius of a test circle for testing a device under test, and
   a means for measuring network properties of this device under test, and a means for testing whether or not the measurements of this measurement means fit within the circle represented by these center coordinates and this radius.

2. The network analyzing apparatus in claim 1, further wherein this testing means tests the network properties of this device under test by finding the difference between the measurements of this measurement means and these center coordinates and comparing the magnitude of this difference and the radius.

3. A network analyzing apparatus, wherein the network analyzing apparatus comprises
   a means for inputting the center coordinates of a test circle for testing a device under test,
   a means for measuring the network properties of a device under test, and
   a means for displaying the measurement of this measurement means on polar coordinates, whose origin is these center coordinates.

4. A network analyzing apparatus, wherein a network analyzing apparatus that analyzes the network properties of a device under test by applying reference signals to the device under test while frequency sweeping or power sweeping comprises
   a first input means for inputting the sweep range and sweep interval of these reference signals,
   a second input means for inputting the center coordinates and radius of a test circle for testing this device under test,
   a first memory means that stores these center coordinates that are input,
   a second memory means that stores this radius that is input,
   a measurement means that measures the network properties of this device under test and obtains measurements for n number of measurement points determined from this sweep range and this sweep interval,
   a third memory means that has elements for these n number of measurement points and that stores the sequence in which these measurements that are obtained are housed in the respective elements, and
   a testing means, which reads these measurements from this third memory means, reads these center coordinates from this first memory means, finds the difference between these measurements that have been read and these center coordinates that have been read, and further, reads the radius from this second memory means and, referring to said difference and said radius that has been read, determines these measurements that have been read pass the test when the magnitude of this referred difference is no greater than this referred radius, or is less than this referred radius.

5. The network analyzing apparatus in claim 4, further wherein this device under test passes the test when all of the measurements housed in each of the elements of the sequence stored in this third memory means pass the test by this testing means.

6. The network analyzing apparatus in claim 4, further wherein it comprises a third input means for inputting, from said sweep range, the inspection range that specifies the range to be tested;
   and in that this device under test passes the test when, of the measurements housed in each element of the sequence stored in this third memory means, all of the measurements within the test range input by this third input means pass the test by this testing means.

7. The network analyzing apparatus in claim 4, further wherein it has a means with which these measurements or this test circle are displayed on these polar coordinates, with the center coordinates serving as the origin of the polar coordinates.

8. The network analyzing apparatus in claim 4, further wherein when these measurements are displayed, they are displayed in different shapes, figures, or colors in accordance with whether or not these measurements have passed the test.

9. A network analyzing apparatus, wherein a network analyzing apparatus that analyzes the network properties of a device under test by applying reference signals to the device under test while frequency sweeping or power sweeping comprises
    a first input means for inputting the sweep range and sweep interval of these reference signals,
    a second input means for inputting the center coordinates and radius of a test circle for determining whether this device under test passes the test,
    a first memory means that has elements for these n number of measurement points and that stores the sequence in which these center coordinates that are input are housed in the respective elements, and
    a second memory means that has elements for these n number of measurement points and that stores the sequence in which this radius that is input is housed in each of these elements,
    a measurement means that measures the network properties of this device under test and obtains measurements for each of these n number of measurement points,
    a third memory means that has elements for these n number of measurement points and that stores the sequence in which these measurements that are obtained are housed in each of these elements, and
    a testing means, which reads these measurements from this third memory means, reads these center coordinates relating to these measurements that have been read from this first memory means, finds the difference between these measurements that have been read and these center coordinates that have been read, and further, reads this radius relating to these measurements that have been read from this second memory means and, referring to this difference and this radius that has been read, determines that these measurements that have been read pass the test when the magnitude of this referred difference is no greater than this referred radius, or is less than this referred radius.

10. The network analyzing apparatus in claim 9, further wherein this device under test passes the test when all of the measurements housed in each of the elements of the sequence stored in this third memory means pass the test by this testing means.

11. The network analyzing apparatus in claim 9, further wherein it comprises a third input means for inputting, of this sweep range, the testing range that specifies the range to be tested,
    and in that this device under test passes the test when, of the measurements housed in each element of the sequence stored in this third memory means, all of the measurements within the testing range input by this third input means pass the test by this testing means.

12. The network analyzing apparatus according to claim 9, further wherein it comprises means with which these measurements or this test circle are displayed on these polar coordinates, with these center coordinates serving as the origin of the polar coordinates.

13. The network analyzing apparatus in claim 9, further wherein when these measurements are displayed, they are displayed in different shapes, figures, or colors in accordance with whether or not these measurements have passed the test.

14. A testing method for testing a device under test in a network analyzing apparatus with which the network properties of said device under test are analyzed by applying reference signals to the device under test while frequency sweeping or power sweeping comprises:
    inputting sweep range and sweep intervals of said reference signals,
    inputting center coordinates and radius of a test circle for testing said device under test,
    storing said center coordinates that are input in a first memory device,
    storing said radius that is input in a second memory device,
    measuring said network properties of said device under test and obtaining measurements for n number of measurement points determined from said sweep range and said sweep interval,
    storing said measurements for n number of measurement points in the respective elements for these n number of measurement points of the sequence in a third memory device,
    reading said measurements for n number of measurement points from said third memory device,
    reading said center coordinates from said first memory device,
    determining the difference between said measurements for n number of measurement points that have been read and said center coordinates that have been read, and
    reading said radius from said second memory device,
    whereby the test is passed when the magnitude of said difference between said measurements for n number of measurement points and said center coordinates is equal to or less than said radius that is read from said second memory device.

15. The testing method according to claim 14 further comprising: determining if said device under test passes the test when all of said measurements housed in each of said elements of the sequence stored in said third memory device pass said test.

16. The testing method according to claim 14 further comprising: inputting a test range that specifies that the range to be tested from said sweep range, and determining that said device under test passes the test when, of said measurements housed in each element of the sequence stored in said third memory device, all of the measurements within said test range input by said third input device pass the test.

17. The testing method according to claim 14 further comprising: displaying said measurements or said test circle on polar coordinates, with said center coordinates serving as the origin of said polar coordinates.

18. A for testing a device under test in a network analyzing apparatus with which the network properties of a device under test are analyzed by applying reference signals to the device under test while frequency sweeping or power sweeping comprises:
    inputting sweep range and sweep interval of said reference signals,
    inputting center coordinates and radius of a test circle for testing said device under test,
    storing said center coordinates that are input in a first memory,
    storing said input radius that are housed in each of the elements for n number of measurement points determined by said sweep range and said sweep interval of the sequence in a second memory, measuring said network properties of said device under test and obtaining measurements for each of said n number of measurement points, storing said measurements that are obtained and housed in each of the elements for said n number of measurement points of the sequence in a third memory device, reading said measurements from said third memory device, reading said center coordinates from said first memory device, determining the difference between said measurements that have been read and said center coordinates that have been read, and reading said radius relating to said measurements that have been read from said second memory device, whereby the test is passed when the magnitude of said difference between said measurements for n number of measurement points and said center coordinates is equal to or less than said radius that is read from said second memory device.

19. A testing method for testing a device under test with network analyzing apparatus with which the network properties of said device under test are analyzed by applying reference signals to the device under test while frequency sweeping or power sweeping comprises:

inputting the sweep range and sweep interval of said reference signals, inputting the center coordinates and radius of a test circle for determining whether said device under test passes the test, storing said center coordinates which are imputed and housed in each of the elements for n number of measurement points determined from said sweep range and said sweep interval of the sequence in said first memory device, storing said radius that is input in a second memory device, measuring said network properties of said device under test to obtain measurements for each of said n number of measurement points, storing said measurements which are housed in these elements for n number of measurement points of the sequence in a third memory device, reading said measurements from said third memory device, reading said center coordinates relating to said measurements that have been read from said first memory device, determining the difference between said measurements that have been read and said center coordinates that have been read, reading said radius from this second memory device, whereby the test is passed when the magnitude of said difference between said measurements for n number of measurement points and said center coordinates is equal to or less than said radius that is read from said second memory device.

20. A testing method that tests a device under test in a network analyzing apparatus with which the network properties of said device under test are analyzed by applying reference signals to said device under test while frequency sweeping or power sweeping comprises:

inputting the sweep range and sweep interval of said reference signals, inputting the center coordinates and radius of a test circle for testing said device under test, storing said center coordinates that are input and housed in each of the elements for n number of measurement points determined by said sweep range and sweep interval of the sequence in a first memory device, storing said radius that is input and housed in each of the elements for these n number of measurement points of the sequence in said second memory device, analyzing said network properties of said device under test to obtain measurements for said n number of measurement points, storing said measurements that are obtained and housed in each of the elements for said n number of measurement points of the sequence in said third memory device, reading said measurements from said third memory device, reading said center coordinates relating to said measurements that have been read from said first memory device, determining the difference between said measurements that have been read and said center coordinates that have been read, and reading said radius relating to said measurements that have been read from said second memory device, whereby the test is passed when the magnitude of said difference between said measurements for n number of measurement points and said center coordinates is equal to or less than said radius that is read from said second memory device.

21. A testing method whereby a device under test is tested in a network analyzing apparatus, said method comprises:

measuring network properties of said device under test, determining whether or not the measurements measured by said device under test are within a test circle represented by center coordinates and radius, and displaying said measurements or said test circle on polar coordinates with said center coordinates serving as the origin of said polar coordinates.

* * * * *